(12) United States Patent
Speckbacher et al.

(10) Patent No.: US 6,800,404 B2
(45) Date of Patent: Oct. 5, 2004

(54) METHOD FOR PRODUCING A SELF-SUPPORTING ELECTRON-OPTICAL TRANSPARENT STRUCTURE, AND STRUCTURE PRODUCED IN ACCORDANCE WITH THE METHOD

(75) Inventors: Peter Speckbacher, Kirchweidach (DE); Georg Flatscher, Schneizlreuth (DE); Michael Allgäuer, Stein/Traun (DE); Erich Bayer, Trostberg (DE); Anton Sailer, Traunstein (DE); Martin Ullrich, Ruhpolding (DE)

(73) Assignee: Dr. Johannes Heidenhain GmbH, Traunreut (DE)

( * ) Notice: Subject to any disclaimer, the term of this patent is extended or adjusted under 35 U.S.C. 154(b) by 42 days.

(21) Appl. No.: 10/209,186

(22) Filed: Jul. 31, 2002

(65) Prior Publication Data

US 2003/0036022 A1 Feb. 20, 2003

(30) Foreign Application Priority Data

Jul. 31, 2001 (DE) .......................................... 101 37 493

(51) Int. Cl.$^7$ ................................................ G03F 1/16
(52) U.S. Cl. ............................ 430/5; 430/296; 205/70; 205/79
(58) Field of Search ....................... 430/5, 296; 205/70, 205/79

(56) References Cited

U.S. PATENT DOCUMENTS

| 4,061,814 A | * | 12/1977 | Politycki ..................... 428/196 |
| 4,080,267 A | * | 3/1978 | Castellani et al. ............. 430/5 |
| 4,497,884 A | * | 2/1985 | Schmidt et al. ................ 430/5 |
| 5,858,576 A | | 1/1999 | Takashi et al. |

FOREIGN PATENT DOCUMENTS

| DE | 1 521 476 | 7/1969 |
| DE | 23 44 111 C2 | 2/1975 |

* cited by examiner

Primary Examiner—John A. McPherson
(74) Attorney, Agent, or Firm—Brinks Hofer Gilson & Lione

(57) ABSTRACT

A method for producing a self-supporting electron-optical transparent structure that includes multi-layer strips and recesses located between the multi-layer strips. The method includes applying a first layer to a second layer, presetting a pattern by exposing or irradiating the first layer and etching the pattern out of the first layer so that partial areas of the second layer are uncovered. The method further includes galvanically applying layers to the uncovered partial areas of the second layer so that multi-layer strips are formed thereon and an electron-optical transparent structure is formed and removing the electron-optical transparent structure off the second layer.

13 Claims, 4 Drawing Sheets

METHOD FOR PRODUCING A SELF-SUPPORTING ELECTRON-OPTICAL TRANSPARENT STRUCTURE, AND STRUCTURE PRODUCED IN ACCORDANCE WITH THE METHOD

Applicants claim, under 35 U.S.C. §119, the benefit of priority of the filing date of Jul. 31, 2001 of a German patent application, copy attached, Serial Number 101 37 493.3, filed on the aforementioned date, the entire contents of which is incorporated herein by reference.

BACKGROUND OF THE INVENTION

1. Field of the Invention

The present invention relates to a method for producing a self-supporting electron-optical transparent structure, composed of strips of several layers and recesses located between the strips. The present invention also relates to a structure produced in accordance with the method.

2. Discussion of Related Art

Electron-optical transparent structures are employed for example as absorbing structures, often also called masks, in electron-beam lithography. For example, periodically repeated patterns ("cell projection"), or patterns of variable size ("variable shaped beam"), are projected by means of these structures, which are capable of beam absorption, on substrates appropriately coated with light-sensitive materials, which in the end can be used as patterns for wafer steppers in the semiconductor industry, or as scale graduations. In the process, electron beams arriving in partial areas, for example strips of the structure, are absorbed by the structure, while the electron beam is spread as unimpeded as possible through recesses between the strips. So that appropriately fine line patterns can be mapped, structures are employed which not rarely have distances of less than 500 nm between the strips, wherein the strip widths are often less than 1 μm. Moreover, the structures should not be too thin in order to achieve the necessary image quality, or the required degree of absorption, so that strip heights of 750 nm and more must be attempted.

A method for producing metallic foil masks is described in laid-open DE 1 521 476, wherein the foil masks are initially placed by vapor deposition on a metal matrix and thereafter are again drawn off this matrix. It is known that by the vapor-deposition process it is only possible to produce foil masks of comparatively little thickness within a reasonable amount of time. Customarily, layer thicknesses of 500 nm are not exceeded today, inter alia because of the long deposition times in the vapor-deposition process.

Masks are known from U.S. Pat. No. 5,858,576, the entire contents of which are incorporated herein by reference. Such masks partially include a multi-layered metal structure. But these layers were applied, for example, by an ion focus beam process, which also entails an uneven shape of the strip edges of the mask. Moreover, in the method in accordance with U.S. Pat. No. 5,858,576 all support substrate layers are removed by an etching process. But etching of these support substrate layers, which as a whole are relatively thick, causes etching remnants to remain in the area of the mask, which decides the function, namely between the strips. Because of the fineness of the structures it is hard to remove these remnants and they interfere with the image quality during the subsequent employment of the mask.

Finally, a mask includes several metal layers is disclosed in German Letters Patent DE 23 44 111. Here, a layer of precious metal is applied by galvanization to a support substrate layer. Following galvanization, the two layers are inseparably connected with each other. Because of the process, no filigreed multi-layered structures can be produced in this way, because for reasons of their being manipulable alone, the support substrate layers must already have a sufficient thickness at the start of the process.

OBJECT AND SUMMARY OF THE INVENTION

An object of the present invention is based on making available a method for producing a self-supporting electron-optical transparent structure, by which it is possible in particular to produce extremely filigreed and accurate patterns. The structures produced in this way differ, inter alia, by their increased fineness and the more even shape of the strip edges.

This object is attained by a method for producing a self-supporting electron-optical transparent structure that includes multi-layer strips and recesses located between the multi-layer strips. The method includes applying a first layer to a second layer, presetting a pattern by exposing or irradiating the first layer and etching the pattern out of the first layer so that partial areas of the second layer are uncovered. The method further includes galvanically applying layers to the uncovered partial areas of the second layer so that multi-layer strips are formed thereon and an electron-optical transparent structure is formed and removing the electron-optical transparent structure off the second layer.

This object is also attained by a self-supporting electron-optical transparent structure that includes multi-layer strips and recesses located between the multi-layer strips. The structure is made by a process that includes applying a first layer to a second layer, presetting a pattern by exposing or irradiating the first layer and etching the pattern out of the first layer so that partial areas of the second layer are uncovered. The method further includes galvanically applying layers to the uncovered partial areas of the second layer so that multi-layer strips are formed thereon and an electron-optical transparent structure is formed and removing the electron-optical transparent structure off the second layer.

The present invention is based on the concept that a fine, multi-layered structure is galvanically applied between border walls to an electrically conductive auxiliary layer, and that the thin structure can be pulled, without being destroyed, off this auxiliary layer. By galvanic application of the layers of the structure it is relatively rapidly and easily possible to obtain layer thicknesses far exceeding 500 nm, so that high-energy electrons can be completely absorbed.

The advantage obtained by the present invention includes making possible the production of extremely filigreed and even self-supporting electron-optical transparent structures.

In accordance with a special embodiment of the present invention, a two-stage etching process is used for bringing out the desired pattern, wherein an electrically conductive layer is used as the etch stop layer. Plasma etching processes are employed in connection with a preferred method variation. Other dry etching or wet etching processes can also be used. For the rest, the term etching not only relates to the dissolution of materials in acids, but also to a corresponding method employing bases.

A galvanic process is understood to be a method wherein layer materials are applied from an ionized state. It is for example possible to electrolytically precipitate metals, such as gold or nickel, out of a preferably aqueous solution to the appropriate surface. Metal ions are discharged and deposited at the cathode. It is possible in the end to build up the desired layer thickness by adjusting the electrical current and the length of the process.

Exemplary embodiments of the present invention will be explained in greater detail by the drawings.

DETAILED DESCRIPTION OF THE PREFERRED EMBODIMENTS

Figure 1A:
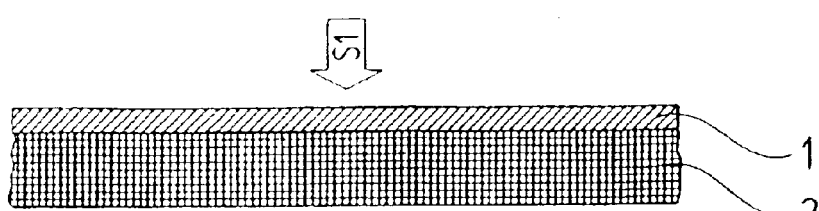
FIGS. 1a to 1k represent partial cross sections through auxiliary layers and layers of an embodiment of a multilayer structure in accordance with the following invention following various process steps of a process in accordance with the present invention.

The basic progression of the method of the present invention is represented by an exemplary embodiment in FIGS. 1a to 1k. The represented layers are generally not shown to scale. A structure 6 is produced by the example shown, which has 1000 parallel strips 6.1, which are 874 nm wide. The recesses 6.2 in the structure 6 are 150 nm wide. Thus, a period of 1024 nm of the structure 6 results.

In step S1, an auxiliary layer 1 of 100 nm thickness, having an iron-nickel alloy (permalloy) is applied in a vacuum by sputtering to a polished and cleaned substrate 2 made of glass, so that a layer structure in accordance with FIG. 1a is created. Alternatively to the material glass it is also possible, for example, to use a corresponding glass-ceramic material, or also steel.

Figure 1B:
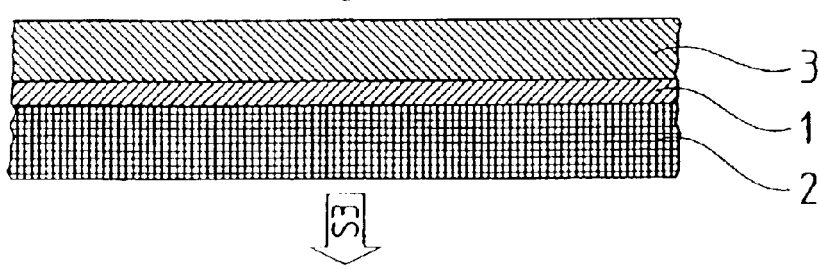
Figure 1C:
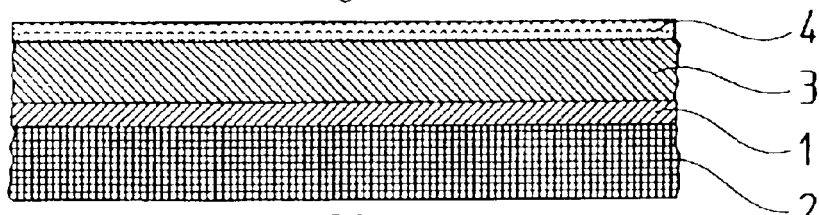

In the next process step S2, an approximately 1.5 $\mu$m thick etchable layer 3 is applied to this auxiliary layer 1 and in this example it includes a photosensitive lacquer (FIG. 1b). The spin-coating process is used as the process for the application. In this case a photosensitive lacquer is placed centered on the auxiliary layer 1 and is then distributed by a lacquer centrifuge, so that the etchable layer 3 of even thickness is created. Thereafter the lacquer is dried in an ambient air drying cabinet. In this example the etchable layer 3 includes a positive lacquer. It is basically also possible to alternatively employ a negative lacquer. Otherwise, with this method it is also possible to use a material for the etchable layers 3 which does not react to radiation, but can be easily removed by etching, or developing. Known photosensitive lacquers are well suited as the material for the etchable layer 3.

The subsequent process step S3 includes the application of a 30 nm thick $TiO_2$ layer 4 on the etchable layer 3 by sputtering. The layer structure produced in this way is represented in partial cross section in accordance with FIG. 1c. It is also possible to select a vaporization process, for example, alternatively to the sputtering process. $TiO_2$ was selected as the layer material in this example, because this material is seldom attacked in the subsequent etching processes using conventional etching media. It would correspondingly also be possible to use layers of chromium or $SiO_2$, etc., as the replacement of $TiO_2$.

Figure 1D:
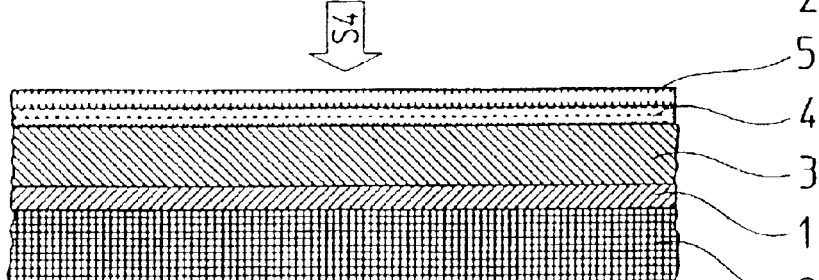

Thereafter, in process step S4 a photosensitive lacquer layer 5 of a thickness of approximately 200 nm is applied on the $TiO_2$ layer 4 and is evenly distributed, similar to the process step S2, by a spin-coating process (FIG. 1d). In this example the photosensitive lacquer layer 5 includes a positive lacquer, but it is possible here, too, to use a negative lacquer.

In a subsequent process step S5, the photosensitive lacquer layer 5 is locally exposed to UV radiation through a lithographic mask, so that a pattern of straight parallel strips is created in the area of the structure 6, which will be formed later. Alternatively to the use of UV radiation it is also possible to employ a different type of radiation known in connection with lithography methods. Thus it is also possible here to provide the exposure by light in the visible range.

Figure 1E:
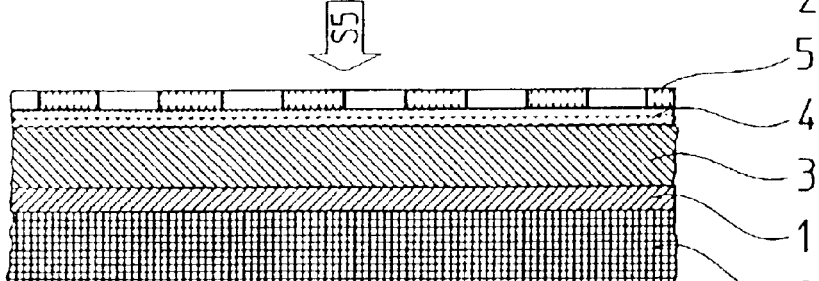

The exposed areas of the photosensitive lacquer layer 5 are removed with the aid of a developing process so that, as represented in FIG. 1e, the $TiO_2$ layer is exposed in small rectangular areas. A photosensitive lacquer developer can be used in this example as the washing medium for the developing process.

Figure 1F:
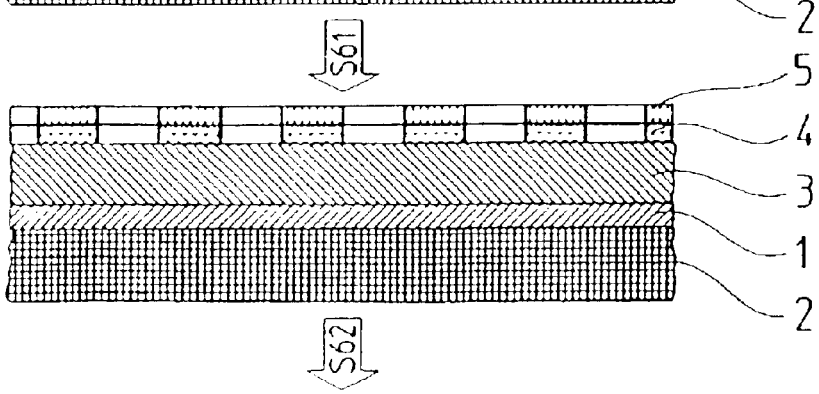

The above mentioned previously exposed areas of the $TiO_2$ layer 4 are removed in process step 61 by plasma-etching ("reactive ion etching") with a fluorine-containing medium. In other words, the $TiO_2$ layer 4 is locally opened (FIG. 1f). In this case fluorine-containing etching media, such as $CHF_3$ gas, $CF_4$ gas, $CBrF_3$ gas or $SF_6$ gas, are used. However, in the same way it is also alternatively possible to use other conventional etching media, for example including chlorine compounds, such as $SiCl_4$.

Figure 1G:
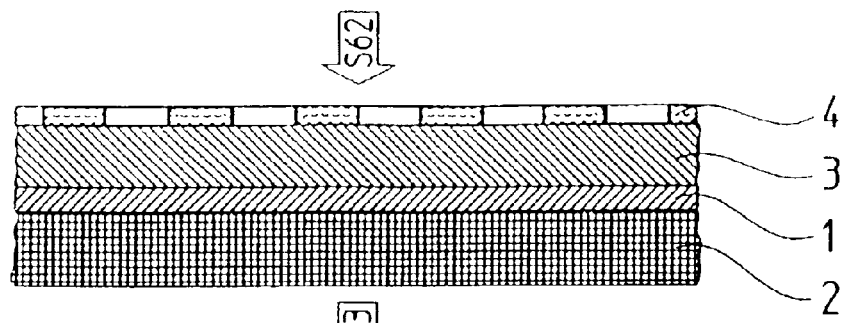

The remaining photosensitive lacquer of the photosensitive lacquer layer 5 is then removed in process step S62 by ashing with the aid of an oxygen plasma method (FIG. 1g).

Figure 1H:
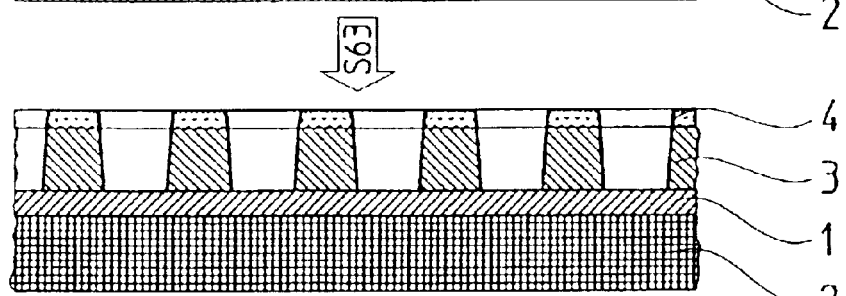
Figure 1I:
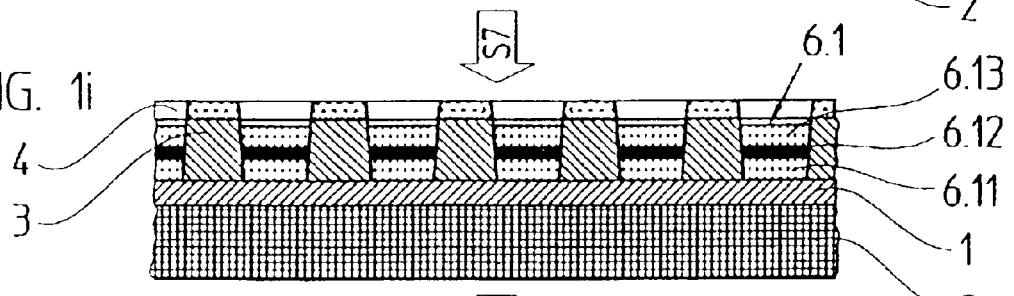

Thereafter the second part of the plasma etching process is performed in process step S63, wherein in accordance with FIG. 1h the electrically non-conducting $TiO_2$ layer 4 is used as etching mask, so to speak.

The process parameters are set in process step S63 in such a way that a desired ratio of the depth etching speed to the lateral etching speed is achieved. In this way underetching, which is desirable to a certain extent, is achieved in this way, so that the strips 6.1 to be formed later has a cross-sectional profile which is optimal for the electron-optical function of the structure 6. The auxiliary layer 1, including the iron-nickel alloy, is also used as an etch stop layer in process step S63. As soon as the appropriate surfaces of the auxiliary layer 1 have been etched free, the end of the plasma etching process is signaled. An oxygen plasma, which is mixed with a fluorine-containing gas, is used here as the etching medium.

The two-stage plasma etching process, together with the use of the $TiO_2$ layer 4 as the etching mask, has the advantage that it is possible to obtain high aspect ratios in the etchable layer 3. Aspect ratio is understood to be the quotient of processing depth to the width of the recess 6.2. In this example, aspect ratios of approximately 1.5 $\mu$m/150 nm=10 are achieved.

FIG. 1h shows that at the end of the etching processes only those remnants of the etchable layer 3 have remained on the auxiliary layer 1, which are now used as borders for the strips 6.1 to be formed. As the first measure of process step S7, a first gold layer 6.11 of a thickness of approximately 540 nm is applied in a galvanic process. The auxiliary layer 1 is used here as the cathode, whose surface is not oxidized in spite of the previous etching process in process step S63, so that it still has satisfactory electrical conductivity for the galvanizing current.

Following this, a nickel layer 6.12, only approximately 120 nm thick, is applied, also galvanically, on the first gold layer 6.11. Finally, a second gold layer 6.13 of approximately 540 nm thickness, is generated on the nickel layer 6.12 in the following step. Because of the desired beveled shape of the strips 6.1, the second gold layer 6.13 is somewhat wider than the first gold layer 6.11. Note that the nickel material of layer 6.12 can be replaced by copper.

By this layer structure it is possible to form a self-supporting structure 6 of a strip height h of 1.2 µm, which is capable of completely absorbing electron beams 8 (see FIG. 3b) of an energy of 20 keV. In this connection the layer, or sandwich, design of the structure 6 is important. The electron beams 8 are absorbed to a sufficient degree by the first gold layer 6.11 and the second gold layer 6.13. But a single-layer gold layer of approximately 1 µm thickness would not be dimensionally stable, or self-supporting. For this reason the nickel layer 6.12 is provided in the center of the structure 6 between the first gold layer 6.11 and the second gold layer 6.13 for stabilizing the structure 6.

Figure 1J:
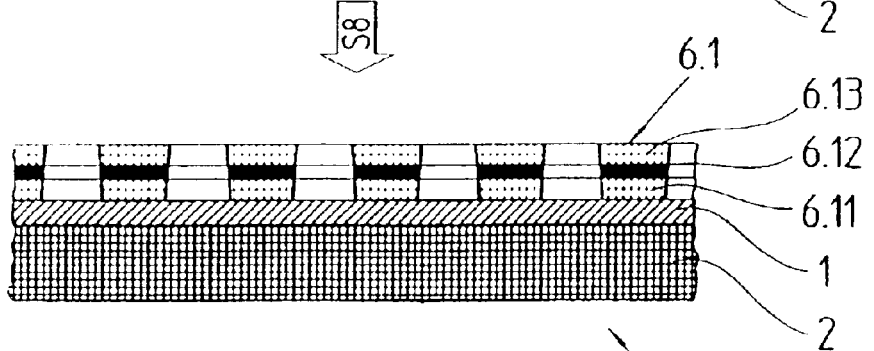

After the buildup of the layers of the multi-layered structure 6 is finished with the strips 6.1, the remaining material of the etchable layer 3 can be removed in process step S8, so that a partial cross section in accordance with FIG. 1j is created. With the represented example, a developing step with a base is again used for this purpose. Alternatively to this it is also possible to use an oxygen plasma, for example, for removing the photosensitive lacquer material.

Figure 1K:
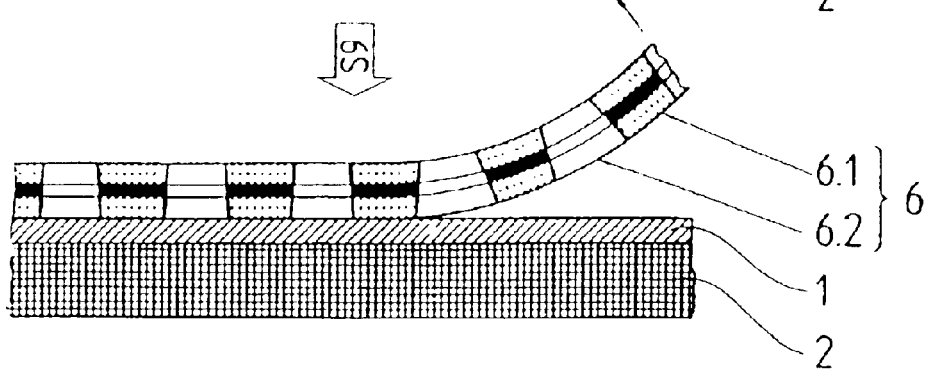

Finally the structure 6 with a strip height h=1.2 µm can be safely pulled off the auxiliary layer 1, without fissures being created in the structure 6 (FIG. 1k). For the damage-free release of the structure 6 from the auxiliary layer 1 it is necessary that the adhesive forces between the structure 6 and the auxiliary layer 1 are not excessive. This property of the auxiliary layer 1 is called release property. When using sputtering techniques, surface structures, which are particularly advantageous for the mentioned release property, are formed on the auxiliary layer 1 in process step S1.

Although a two-stage etching process is employed in the described example, the present invention is not limited to this type of operation. It is also possible to perform a one-stage etching process.

Figure 2:
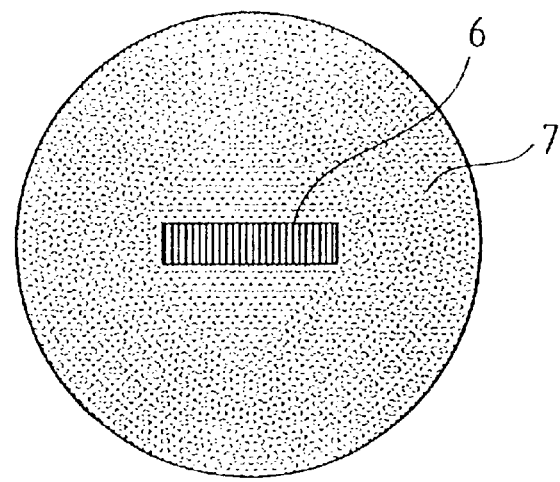
FIG. 2 is a view from above of the multilayer structure of FIG. 1k with a metal foil enclosing the multilayer structure.

In accordance with FIG. 2, a finished structure 6 is enclosed in a metal foil 7. Primarily the metal foil 7 is used for easing the handling of the structure 6, in particular for the draw-off process and for the later use of the structure 6 in accordance with the purpose. The structure 6 and the metal foil 7 are produced in one manufacturing process and therefore have the same layer structure. Thus, in this example the structure 6 is only a special area of the metal foil 7 with the recesses 6.2.

However, the layer structure can also be produced in such a way that, for improving the mechanical stability of the structure 6 and of the metal foil 7 enclosing the structure 6, further layers are applied which, for example, have a net-like shape.

Figure 3A:
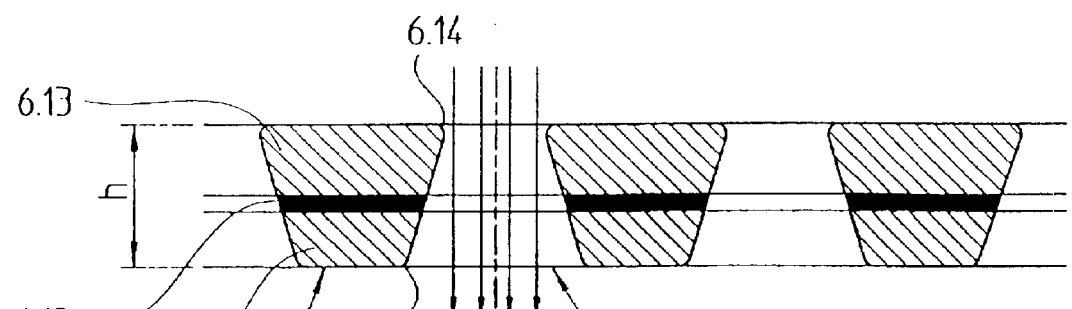
FIG. 3a shows a partial cross section through the multilayer structure of FIG. 1k with schematically indicated electron beams.
Figure 3B:
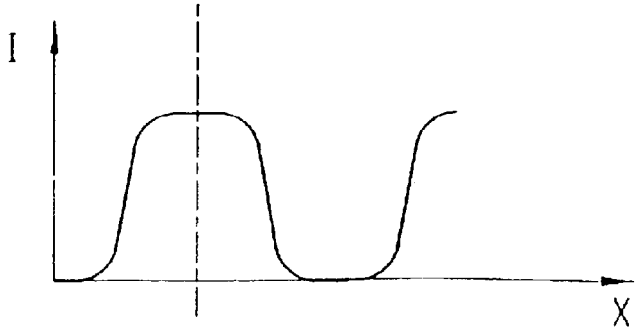
FIG. 3b represents the intensity distribution of the electron beams over the location after passing the multilayer structure of FIG. 1k.

A structure 6 is represented (not to scale) in FIG. 3a, whose strips 6.1 have an optimized cross-sectional profile. The associated diagram, in which the radiation intensity at the location x has been indicated, is represented in FIG. 3b.

Important advantages of the structure 6 in accordance with the present invention can be easily seen in this exemplary embodiment by the resulting intensity distribution. For one, practically no radiation can be found in relatively large areas in the shadow of the strips 6.1, this means that the strips 6.1 absorb almost the entire radiation. This occurs for one because of the selection of the material of the layers 6.11 and 6.13 (gold), and also because of the comparatively thick layer structure made possible by the galvanic method. Moreover, the cross-sectional shape of the strips 6.1 plays a substantial role in the maintenance of an appropriate intensity distribution. By the undercut strips 6.1 it is avoided that noticeable reflections of the electron beams 8 are created at the walls of the strips 6.1 which border the recesses 6.2.

The above mentioned reasons inter alia contribute to the fact that a comparatively sharp intensity distribution of the radiation is achieved. Currently customary structures have, for example because of their different cross-sectional profiles, strip edge embodiments and layer thicknesses, a much flatter intensity distribution, i.e. that no such pronounced intensity differences can be noted at the transition from a strip 6.1 to a recess 6.2.

Added to this is that, because of the production method, very straight and smooth strip edges 6.14 and 6.15 in the direction perpendicular to the drawing plane are achieved. In comparison to this, when applying comparative structures by means of the sputter process, a course of the edges is created, which is wavy, or serrated, perpendicular to the drawing plane. The cause of this is that with sputtering an increased layer buildup is always noted in the edge areas, because material is there also deposited on the border walls. When removing the border walls, these deposits break off in an accidental pattern, so that a correspondingly irregular course of the edges in the longitudinal direction is created.

The present invention is not limited to the three-layered structure 6 represented in the exemplary embodiment, but also includes structures 6 of two, four or more layers of the most diverse material and sequences of rows of layers. A preferred embodiment of the present invention is a structure 6 with a symmetrical layer buildup, wherein in this connection the symmetry is to be related to the selection of the material (Au—Ni—Au in the represented example) and/or to the layer thickness (540 nm–120 nm–540 nm in the example represented).

Figure 4A:
FIGS. 4a and 4b show scanning electron microscope images of structures in cross section formed by the multilayer structure of FIG. 1k.

A scanning electron microscope photograph is represented in FIG. 4a, in which a partial cross section through the strips 6.1, through the limiting layers of the etchable layer 3, as well as through the auxiliary layer 1 and through the support substrate 2, is represented. The representation corresponds to FIG. 1i.

Figure 4B:

FIG. 4b shows a partial cross section through the strips 6.1 following their release from the auxiliary layer 1.

Within the scope of the present invention, further embodiment variations of course also exist besides the explained example.

We claim:

1. A method for producing a self-supporting electron-optical transparent structure comprising multi-layer-strips and recesses located between said multi-layer strips, said method comprising:

applying a first layer to a second layer;

presetting a pattern;

etching said pattern out of said first layer so that partial areas of said second layer are uncovered;

galvanically applying layers to said uncovered partial areas of said second layer so that multi-layer strips are formed thereon and an electron-optical transparent structure is formed; and removing said electron-optical transparent structure off said second layer.

2. The method in accordance with claim 1, wherein following said applying said first layer to said second layer and prior to etching said pattern out of said first layer the following are performed:

applying a third layer to said first layer;

covering said third layer with a photosensitive lacquer layer;

exposing or irradiating said photosensitive lacquer layer in accordance with said pattern; and removing at least partially said photosensitive lacquer layer and said third layer by an etching process.

3. The method in accordance with claim 1, wherein said first layer is removed prior to said removing said electron-optical transparent structure off said second layer.

4. The method in accordance with claim 1, further comprising applying said second layer to a support substrate.

5. The method in accordance with claim 4, wherein said second layer is applied to said support substrate by a sputter process.

6. The method in accordance with claim 1, wherein said multi-layer strips comprise at least one gold layer.

7. The method in accordance with claim 1, wherein said multi-layer strips comprise at least one nickel layer.

8. The method in accordance with claim 1, wherein said multi-layer strips comprise a copper layer.

9. The method in accordance with claim 1, wherein said second layer comprises an iron-nickel alloy.

10. A self-supporting electron-optical transparent structure comprising multi-layer strips and recesses located between said multi-layer strips, said structure made by a process comprising:

applying a first layer to a second layer;

presetting a pattern;

etching said pattern out of said first layer so that partial areas of said second layer are uncovered;

galvanically applying layers to said uncovered partial areas of said second layer so that multi-layer strips are formed thereon and an electron-optical transparent structure is formed; and removing said electron-optical transparent structure off said second layer.

11. The self-supporting electron-optical transparent structure in accordance with claim 10, wherein said multi-layer strips comprise at least one nickel layer and at least one gold layer.

12. The self-supporting electron-optical transparent structure in accordance with claim 10, wherein said multi-layer strips comprise a copper layer and at least one gold layer.

13. The self-supporting electron-optical transparent structure in accordance accordance with claim 10, wherein widths of said multi-layer strips are changed in a direction of height of said multi-layer strips.

* * * * *